United States Patent [19]
Markowitz

[11] 3,949,312
[45] Apr. 6, 1976

[54] FREQUENCY SCANNING MEANS AND METHOD

[75] Inventor: Raymond S. Markowitz, Wyncote, Pa.

[73] Assignee: American Electronic Laboratories, Inc., Lansdale, Pa.

[22] Filed: Sept. 16, 1974

[21] Appl. No.: 506,029

[52] U.S. Cl.............. 328/137; 324/77 C; 325/452; 329/124; 331/19
[51] Int. Cl.² ..................... H03D 7/16; G01R 23/00
[58] Field of Search .......... 329/110, 112, 124, 122, 329/125; 331/11, 12, 14, 17, 18, 19; 325/322, 324, 452, 467, 468, 478, 303, 304; 328/137, 140; 324/77 C, 77 CS

[56] References Cited
UNITED STATES PATENTS

| | | | |
|---|---|---|---|
| 3,121,202 | 2/1964 | Gray | 329/124 X |
| 3,397,360 | 8/1968 | Kaneko et al. | 325/478 X |
| 3,729,738 | 4/1973 | Cross et al. | 324/77 C X |
| 3,748,590 | 7/1973 | Gray | 329/124 X |

Primary Examiner—Alfred L. Brody
Attorney, Agent, or Firm—Jacob Trachtman

[57] ABSTRACT

Frequency scanning means and method comprising a broadband signal discriminator means for receiving and delivering signals within its frequency band, detecting means receiving signals delivered by the discriminator means and providing output signals related to the frequencies of the received signals, signal generating means selectively providing output signals corresponding to the frequencies of signals within the band of said discriminator means, and signal processing means receiving the output signals of said detecting means and said generating means and delivering an output signal for each signal delivered by said discriminator means having a frequency selected by said generating means, and including gating means receiving signals from the discriminator means and the processing means and delivering signals from the discriminator means during receipt by the gating means of signals from the processing means.

21 Claims, 4 Drawing Figures

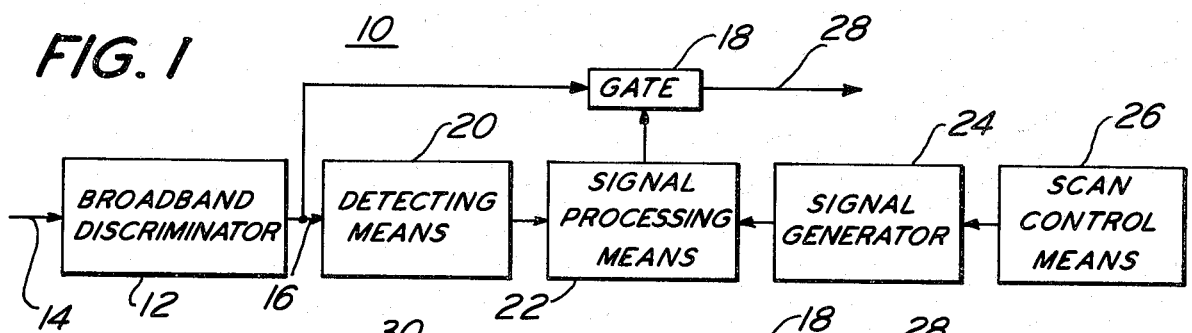
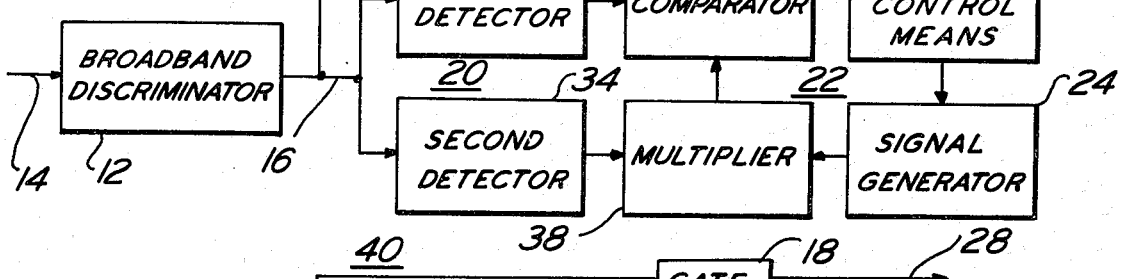
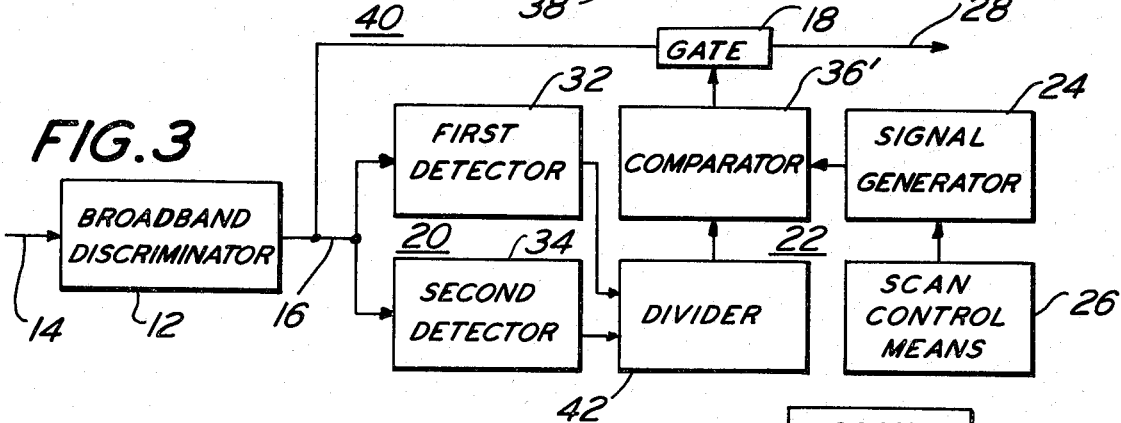
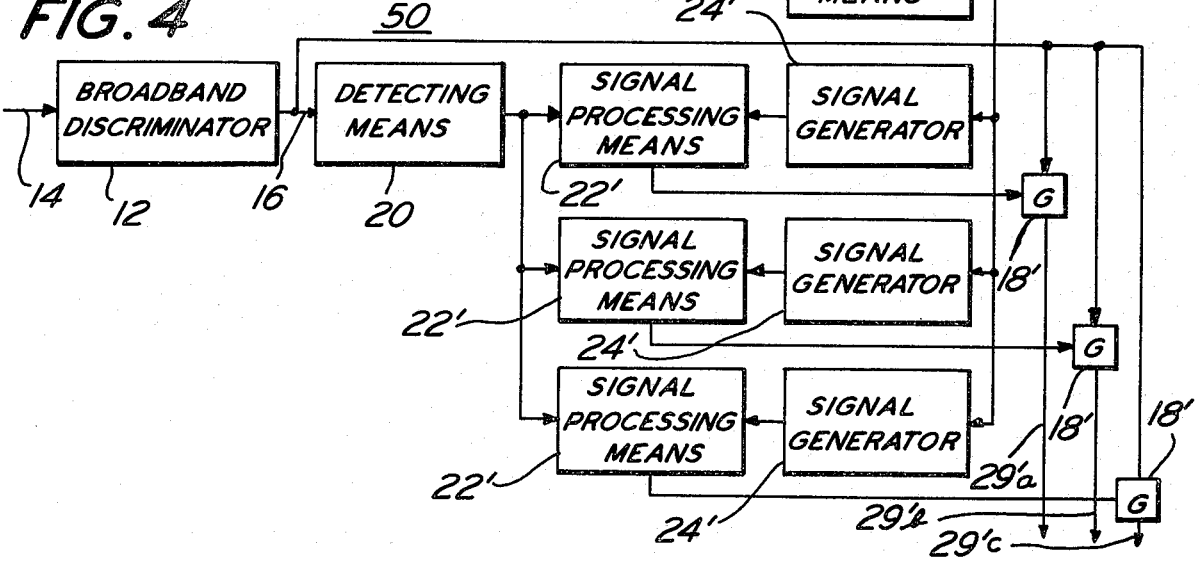

FREQUENCY SCANNING MEANS AND METHOD

The invention relates to a frequency scanning means and method, and more particularly to a frequency scanning means and method which receives signals within a broadband of frequencies and delivers signals having selected frequencies within the broadband of frequencies.

Heretofore, signals of desired frequencies have been selected by use of variable tuning elements well known in the art. The present invention provides a means and method utilizing a fixed broadband of signal frequencies such as those in the radio frequency or microwave range, and providing a synthesized tuning and filtering capability with a variable bandwidth as would be useful for receivers and other applications. The synthesized tuning and filtering capability allows instantaneous selection of signals having frequencies in the braodband of frequencies, and permits the selected frequencies to be scanned or otherwise controlled as function of time within the fixed band of frequencies. The sweep patterns and controls are provided electrically without requiring physical adjustment necessary in tuning conventional components.

It is therefore a primary object of the invention to provide a new and improved frequency scanning means and method for instantaneously selecting signals with frequencies within the broadband of frequencies.

Another object of the invention is to provide a new and improved frequency scanning means and method which may rapidly scan and instantaneously select signals with frequencies provided by a scanning pattern.

Another object of the invention is to provide a new and improved frequency scanning means and method allowing concurrent receipt of a plurality of different signals within a predetermined fixed broadband of frequencies and selecting one or more of the received signals as a function of frequency and time.

Another object of the invention is to provide a new and improved frequency scanning means and method utilizing a synthesized tuning capability having a variable bandwidth and electrically controlled to provide an effective and instantaneous selection of received signals and bandwidth control.

Another object of the invention is to provide a new and improved frequency scanning means and method which delivers signals of selected frequency without being affected by modulation or attenuation variations in amplitude of the received signals.

Another object of the invention is to provide a new and improved frequency scanning means and method allowing the concurrent receipt and selection of signals of varying frequencies and delivery of concurrently selected signals over respective output lines.

The above objects as well as many other objects of the invention are achieved by providing a frequency scanning means comprising a broadband signal discriminator means for receiving and delivering signals within its frequency band and detecting means receiving signals delivered by the discriminator means and providing output signals related to the frequencies of the received signals. Signal generating means are included for selectively providing output signals corresponding to the frequencies of the signals within the band of the discriminator means, while signal processing means receive the output signals from the detecting means and the generating means and deliver output signals for input signals delivered by the discriminator means having a frequency selected by the generating means. Gating means receive signals from the discriminator means and the processing means and deliver signals from the discriminator means during receipt by the gating means of a signal from the processing means.

The detecting means includes first and second detectors respectively providing first and second output signals which are respective functions of the frequency of each received signal, while the signal processing means includes signal multiplying means receiving signals from the second detector and from the signal generating means and delivering an output signal and comparator means for receiving the signals from the first detector and the multiplying means and delivering output signals to the gating means upon predetermined correspondence between its input signals.

In another form the signal processing means includes a signal dividing means receiving signals from the first and second detectors of the detecting means and delivering an output signal which is a function of frequency of signals delivered by the discriminator means, and comparator means receiving the signals from the dividing means and the signal generating means and delivering an output signal to the gating means upon predetermined correspondence between its input signals.

The method of the invention includes the steps of receiving signals with frequencies within a broadband of frequencies, detecting signals received within the frequency band and providing output signals related to the frequencies of the received signals, selectively generating signals which correspond to the signal frequencies within the band of frequencies, and processing the detected signals and the generated signals and producing an output signal for each predetermined relationship between the detected signals and generated signals. The method includes a further step of delivering the signals received within the broadband of frequencies upon the production of an output signal during the processing step.

The foregoing and other objects of the invention will become more apparent as the following detailed description of the invention is read in conjunction with the drawing, in which:

FIG. 1 is a block diagram illustrating a frequency scanning means embodying the invention, FIG. 2 is a block diagram illustrating in greater detail the frequency scanning means of FIG. 1, FIG. 3 is a block diagram illustrating a modified form of the frequency scanning means shown in FIG. 2, and FIG. 4 is a block diagram illustrating a frequency scanning means embodying the invention and providing a plurality of signal outputs.

Like numerals designate like parts throughout the several views.

Refer to FIG. 1 which discloses in block form a frequency scanning means 10 embodying the invention. The scanning means 10 includes a broadband discriminator 12 which may be a band-pass filter or any other such means for receiving signals at its input 14 and delivering at its output 16 signals which are within a predetermined fixed broadband of frequencies. The input signals may be radio frequency or microwave signals of short or long duration and occuring within the band-pass spectrum. For example, the input signals may be radar pulses occurring at different times and at different locations of the band-pass frequency spectrum. On the other hand, signals of long duration and occuring at different frequencies within the band-pass spectrum may also be received at the input 14 of the discriminator means 12 and delivered at its output 16. Of course, received signals which are outside of the band-pass limits are attenuated and not delivered at the output 16 of the discriminator 12.

The signals delivered on the line 16 are received at the input of a gate 18 and the input of a detector means 20. The detector means 20 provides an output signal to a signal processing means 22. The output signal of the detector means 20 is a function of the frequency of the input signal to the detector means 20.

The signal processing means 22 also receives an input signal from a signal generator 24. The signal generator 24 selectively provides output signals corresponding to the frequencies of signals within the band-pass of the discriminator 12. The selected output signal of the signal generator 24 is determined by a scan control means 26 which delivers a control signal to the generator 24.

The signal processing means 22 delivers an output signal to the gate 18 when the signal from the detecting means is provided by an input signal having a frequency corresponding to the selected frequency of the generator 24. The output signal from the processing means 22 to the gate 18 conditions the gate 18 for passing the output signal from the discriminator 12 to the output line 28.

In operation, with the various signals occurring at different times and with various frequencies within the fixed broadband of frequencies of the discriminator 20, such signals are delivered to the gate 18 and the detecting means 20. On those occasions when the signal generator 24 provides a signal to the processing means 22 which corresponds to the frequency of an incoming signal, the detecting means 20 delivers a signal to the processing means which results in enabling the gate 18 to pass the signal to the output line 28. Other signals which have frequencies not selected by the signal generator 24 provide output signals by the detecting means 20 which do not result in the production of gating signals by the processing means 22. However, when the gate 18 is conditioned for passing signals by the presence of a signal with the selected frequency, all other signals delivered concurrently are also passed by the gate to the output line 28 with the selected signal.

Thus, in operation, the frequency scanning means 10 operates instantaneously to select and pass signals having the selected frequency. The signals which are gated through to the output line 28 are controlled by the signal generator 24. In the absence of a signal from the generator 24, no signals are passed to the output line 28 and signals with the selected frequency are passed only during intervals of time during which the signal generator 24 delivers its signal to the processing means 22. Such action is instantaneous. With the signal from the signal generator 24 controlled by the scan control means 26, the frequency scanning means 10 may be scanned for signals with frequencies occurring within the broadband of frequencies of the discriminator 12. Such scanning may take place in the form of a continuous sweeping action at desired constant or varying sweep rates, or the frequencies selected may be random or in a predetermined time and frequency pattern. Thus, it may be desirable to scan a particular frequency range within the band-pass spectrum for a longer interval or period than other frequency ranges of the band-pass spectrum. This may readily be accomplished by use of the scan control means 26 which may be programmed to meet particular requirements.

The output signals from the detecting means 20 and signal generator 24 may be amplitude or frequency modulated signals or may take the form of digital information signals for the operation of the frequency scanning means 10. Similarly, the processing means 22 may be an analog processing device or a digital processing means or a combination of the two for the purposes of the invention.

The bandwidth or variation of signal frequency of received signals from the selected frequency which will still result in delivery of a gating signal to the gate 18 may also be controlled by the processing means 22. This controls the bandwidth of signals which are passed by the gate 18. Thus, if it is desirable to enable the gate 18 only if a signal occurs at a precise selected frequency, the processing means 22 provides a narrow bandwidth, whereas if it is desirable to pass signals which come within a predetermined range of the selected frequency, then a broader bandwidth is provided. The manner in which such bandwidths may readily be selected and controlled will be described below in connection with a more detailed description of the invention.

FIG. 2 is a more detailed block diagram of a frequency scanning means 30 within the scope of the frequency scanning means 10 of FIG. 1. In FIG. 2, the detecting means 20 is illustrated as comprising a first detector 32 and a second detector 34 each receiving the output signals on line 16 from the broadband discriminator 12. The signal processing means 22 comprises a comparator 36 which receives output signals from the first detector 32, and a multiplier 38 which receives output signals from the second detector 34. The multiplier 38 also receives the output signals from the signal generator 24 and delivers an output signal to the comparator 36. The comparator 36 delivers an output signal to the gate 18 for enabling the gate to pass signals from line 16 to the output line 28.

In operation, the first detector 32 delivers output signals which are a function of the frequency of the input signals within the broadband of frequencies of the discriminator 12. The second detector 34 likewise delivers a respective output signal which is a function of frequency of the input signal, with the signals from the first and second detectors 32 and 34 being different functions of frequency of the input signals. The multiplier 38 multiplies the signal from the second detector 34 by the signal from the signal generator 24 and provides a resultant signal to the comparator. The comparator compares the signal from the multiplier 38 with the output signal from the first detector 32 and upon the occurrence of a predetermined corresponding relationship between the input signals, delivers an output signal conditioning the gate 18 to pass the signals received on line 16 to output line 28. Thus, the signal delivered by the signal generator 24 controls the conditions under which the received signals are passed by the gate 18.

The operation of the first and second detectors 32 and 34, which deliver different functions of frequency and which signals are compared by the comparator 34 results in the frequency scanning means 30 being insensitive to variations in amplitude of the incoming signals in its function of determining the frequency of the incoming signal for the delivering of signals of selected frequency to the output line 28. This manner of operation, will become more evident in connection with the following example of a particular embodiment of the frequency scanning means 30, although the invention is not limited to the particular form described.

The first detector 32 in a particular form of the invention delivers an output signal which is a sine function of the frequency of the input signal over the band of frequencies passed by the discriminator 12. On the other hand, the second detector 34 provides an output signal which is a cosine function of frequency over the same frequency range of the discriminator 12. For the purpose of this example the signal generator 24 provides an output signal which is a tangent function of frequency within the frequency band of said discriminator. The sine, cosine and tangent functions of frequency (w) may thus be represented as follows:

$$A \sin wt \quad (1)$$

$$A \cos wt \quad (2)$$

$$A \tan wt = \frac{\sin wt}{\cos wt} \quad (3)$$

where $t$ is time.

The multiplication by the multiplier 38 of the cosine signal (2) from the detector 34 and the tangent signal (3) of the generator 24 provides an output signal $$A \cos wt \times \frac{\sin wt}{\cos wt} = \quad (4)$$

$$A \sin wt \quad (5)$$

The comparator 36 compares the sine signal (1) from the first detector 32 with the resultant sine signal (5) from the multiplier 38. When the frequency ($w_2$) selected by the signal generator 24 corresponds to the frequency ($w_1$) of an input signal at the line 16, the input signals to the comparator 36 are equivalent and the comparator 36 delivers an output signal to the gate 18. On the other hand, if the selected frequency ($w_2$) of the signal generator 24 does not equal the frequency ($w_1$) of a signal received by the detector means 20, the sine signals (1) and (5) delivered to the comparator 36 will not be equal and the gate 18 will prevent delivery of signals to the output line 28. Since the amplitude coefficient A is present in the signal (1) from the first detector 32 and in the signal (5) from the multiplier 38, the amplitude of the incoming signal on line 16 does not effect the determination of the selected frequency, and the apparatus operates to select output signals on the basis of frequency on both high level and low level input signals. Similarly, any amplitude modulation of the input signals are cancelled out and has no effect on the determination of the signal frequency.

The sine and cosine signals as a function of frequency may be instantaneously produced by the first and second detectors 32 and 34 by respectively utilizing an open stub and a shorted stub to which signals from the discriminator 12 are delivered. A power divider may be utilized for delivering equal power to each of the stubs. The standing waves produced by the stubs are sampled by matched detectors which provide the output signals respectively to the comparator 36 and multiplier 38. To consider the matter in more detail, the standing wave produced by a shorted stub is given by $$e_1' = A \sin wt \sin (w/c) d \quad (6)$$

where $A$ is signal amplitude, $w$ is radian frequency, $c$ is the velocity of the wave, and $d$ is the distance from the short. In a similar manner, the standing wave on the open stub is provided by $$e_2' = A \sin wt \cos (w/c) d \quad (7)$$

With linear detectors the outputs of the detectors 32 and 34 respectively become $$e_1' = A \sin (w/c) d \text{ and} \quad (8)$$

$$e_2' = A \cos (w/c) d \quad (9)$$

Thus the detectors 32 and 34 provide respectively sine and cosine signals which are a function of the freqency of the incoming signals. Although the examples provided sine and cosine functions of frequency which are continuous functions, other functions including non continuous functions may also be utilized.

FIG. 3 is a block diagram of a frequency scanning means 40 which is a modified form of the frequency scanning means 30. In this embodiment the signal processing means 22 includes a comparator 36' and a divider 42. The divider 42 receives input signals from the first and second detectors 32 and 34 and delivers its output signal to the comparator 36'. The comparator 36' also receives an input signal from the signal generator 24. Thus in operation, the signal from the first detector 32 is divided by the signal from the second detector 34 and the quotient is delivered to the comparator 36' where it is compared with the signal from the signal generator 24. With the occurrence of the predetermined correspondence between the input signals to the comparator 36', a signal is delivered to the gate 18 permitting delivery of signals from the discriminator 12 to the output line 28.

In a situation where the first and second detectors 32 and 34 respectively deliver sine and cosine functions of the input signals and the signal generator provides an output signal corresponding to the tangent function of frequency, as in the example given above, the means 40 operates as follows. The sine signal (1) from the detector 32 is divided by the cosine signal (2) from the detector 34 and results in delivery of a tangent function of frequency by the divider 42 to the comparator 36'. When the selected freqency ($w_2$) of the generator 24 equals the frequency ($w_1$) of an incoming signal, the tangent signal delivered by the divider 42 to the comparator 36' is equal to the tangent signal (3) from the signal generator 24. This results in delivery of the gating signal to the gate 18.

The scanning means may also be provided with a variable bandwidth for signals delivered to the output line 28. Thus, when the comparator 36' is designed or controlled to provide an output signal only when identical signals are delivered by the divider 42 and the signal generator 24, the comparator 36' will not deliver an output signal except when the input signal has the identical frequency of the selected frequency. This provides a narrow bandwidth for the selection and delivery of the signals by the gate 18. On the other hand, if the comparator 36', is conditioned to deliver an output signal when the input signal delivered to it is within a predetermined range of values, then the comparator 36' will deliver an output signal for signals within such range of the selected frequency. This provides a selected bandwidth for passing signals through the gate 18. Thus, the precision with which signals are selected may be varied according to the needs of particular scanning programs and operational requirements.

As noted previously, in connection with the scanning means 30 the division of the sine by cosine signals delivered by the first and second detectors 32 and 34 of the scanning means 40 also results in cancelling the amplitude coefficient A, so that variations in amplitude of the incoming signals due to different strengths, or because of amplitude modulation of such signals to not effect the operation of the scanning means in instantaneously determining and passing signals of selected frequency to its output line 28.

FIG. 4 is a block diagram of a frequency scanning means 50 which is a modified form of the scanning means 10 in FIG. 1. The scanning means 50 is similar to that of the scanning means 10 except that a plurality of signal processing means 22' are provided, each receiving the ouput signals from the detecting means 20. Each of the signal processing means 22' is provided with a signal generator 24' which is controlled by scanning control means 26'. A gate 18' is provided for each of the signal processing means 22. The gate 18' receives input signals from the output line 16 of the discriminator 12 and deliver output signals to respective output lines 29'a, 29'b and 29'c when conditioned by its processing means 22'.

In operation, each signal processing means 22' is provided with the output signal from its signal generator 24'. The signal generators 24' have their output signals respectively controlled by the scan control means 26' so that they may be individually programmed to scan various frequency ranges during different periods of time, or to select only a particular frequency. Each of the processing means 22' delivers an output signal to its respective gate 18' upon delivery on line 16 of a signal having its respective selected frequency. The respective gates 18' are conditioned upon such coincidence to deliver the signals on line 16 to their respective output lines 29'a, 29'b and 29'c. The frequency scanning means 50, thus, provides an apparatus which delivers certain selected frequencies over individual output lines or channels and allows individual programming for delivery of selected signals to respective lines, while still utilizing the signal broadband discriminator 12 which passes all signals within its broadband spectrum. The detecting means 20 and signal processing means 22' may be in the particular forms illustrated in FIGS. 2 and 3 and the first and second detectors may provide sine and cosine functions of frequency as illustrated in connection with the scanning means 30 and 40, or any other desirable functions or arrangements for providing the desired operation of the device.

It will, of course, be understood that the description and drawing herein contained are illustrative merely, and that various modifications and changes may be made in the structure and method disclosed without departing from the spirit of the invention.

What is claimed is:

1. A frequency scanning means comprising a broadband signal discriminator means for receiving and delivering signals within its frequency band, detecting means receiving signals delivered by the discriminator means and providing output signals related to the frequencies of the received signals, signal generating means selectively providing output signals corresponding to the frequencies of signals within the band of said discriminator means, and signal processing means receiving the output signals from said detecting means and said generating means and delivering an output signal for each signal delivered by said discriminator means having a frequency with a predetermined correspondence to the frequency selected by said generating means, and gating means delivering signals from said discriminator means upon the occurrence of output signals from said processing means.

2. The frequency scanning means of claim 1 in which said gating means has inputs receiving signals from said discriminator means and said processing means and delivers signals from said discriminator means during receipt by the gating means of a signal from said processing means.

3. The frequency scanning means of claim 2 in which the detecting means delivers an output signal which varies as a continuous function of the frequency of its received signal within the frequency band of said discriminator means.

4. The frequency scanning means of claim 2 in which the detecting means includes first and second detectors respectively providing first and second output signals which are respective functions of the frequency of each received signal.

5. The frequency scanning means of claim 4 in which the signal processing means includes signal multiplying means receiving the signals from the second detector of said detecting means and from the signal generating means and delivering an output signal, and comparator means receiving the signals from said first detector and said multiplying means and delivering an output signal upon predetermined correspondence between said input signals.

6. The frequency scanning means of claim 5 in which the first detector of said detecting means provides an output signal which is a sine function of the frequency of the signal from said discriminator means, while the second detector provides an output signal which is a cosine function of the frequency of the received signal from said discriminator.

7. The frequency scanning means of claim 6 in which the signal generating means provides an output signal which is a tangent function of frequency within the frequency band of said discriminator.

8. The frequency scanning means of claim 4 in which the signal processing means includes signal dividing means receiving the signals from said first and second detectors of said detecting means and delivering an output signal which is a function of frequency of signals delivered by said discriminator means, and comparator means receiving the signals from the dividing means and said signal generating means and delivering an output signal upon predetermined correspondence between said input signals.

9. The frequency scanning means of claim 8 in which the first detector of said detecting means provides an output signal which is a sine function of the frequency of the signal from said discriminator means, while the second detector provides an output signal which is a cosine function of the frequency of the received signal from said discriminator, and the signal generating means provides an output signal which is a tangent function of frequency within the frequency band of said discriminator.

10. The frequency scanning means of claim 4 in which said detecting means include an open stub receiving signals from said discriminator means and providing standing waves for delivering signals to the first detector for providing output signals which are a sine function of frequency and a shorted stub receiving signals from said discriminator means and providing standing waves for delivering signals to the second detector for providing output signals which are a cosine function of frequency.

11. The frequency scanning means of claim 1 which includes control means for selecting the output signals provided by said signal generating means.

12. The frequency scanning means of claim 1 in which said signal generating means includes a plurality of signal generators each selectively providing output signals corresponding to the frequencies of signals within the band of said discriminator means, said processing means having a plurality of input and output lines corresponding respectively to said plurality of generators, the input lines of said processing means each receiving a respective signal of one of said generators, the output lines of said processing means each respectively delivering an output signal for each signal delivered by said discriminator with a predetermined correspondence to the frequency selected by its corresponding generator, and said gating means including a plurality of gates each receiving signals from said discriminator means and from a respective one of the output lines of said signal processing means and delivering signals from said discriminator means during its receipt of a signal from said processing means.

13. The frequency scanning means of claim 12 which includes control means for selecting the respective output signals provided by said plurality of signal generators.

14. A method of frequency scanning a broadband of signals including the steps of
   a. receiving signals with frequencies within a broadband of frequencies,
   b. detecting signals received within said frequency band and providing output signals related to the frequencies of the received signals,
   c. selectively generating signals which correspond to the signal frequencies within said band of frequencies,
   d. processing said detected signals and said generated signals and producing an output signal for each predetermined relationship between the detected signals and the generated signals, and
   e. delivering said received signals of step (a) when an output signal is produced during the processing step (d).

15. The method of claim 14 which includes providing during the detecting step (b) first and second output signals which are respective functions of the frequency of each received signal.

16. The method of claim 15 in the first output signal provided during the detecting step (b) is a sine function of the frequency of the received signals and the second output signal is a cosine function of the frequency of the received signals, and the signals generated in step (c) are a tangent function of the signal frequencies within said band of frequencies.

17. The method of claim 16 in which the second output signals provided by the detecting step (b) are multiplied by the signals of the generating step (c) and the resultants are compared with the first output signals of the detecting step (b) for determining during step (d) said predetermined relationship between said signals.

18. The method of claim 16 in which the first output signals provided by the detecting step (b) are divided by the second output signals provided by the detecting step (b) and the quotients are compared with the signals of the generating step (c) for determining during step (d) said predetermined relationship between said signals.

19. The method of claim 14 including the step of controlling the selected generated signals of step (c) as a function of time for scanning said band of frequencies.

20. The method of claim 14 in which a plurality of signals corresponding to respective channels are concurrently produced during said generating step (c) and which includes the step of delivering signals received in step (a) into a plurality of channels corresponding to said generated signals upon production of output signals during said processing step (d) upon the occurrence of said predetermined relationship between respective ones of said generated signal and said detected signals of step (b).

21. The method of claim 20 including the step respectively controlling the plurality of signals produced during said generating step (c) as functions of time for scanning said band of frequencies.

* * * * *